(12) United States Patent
Johnson et al.

(10) Patent No.: US 10,838,156 B2
(45) Date of Patent: Nov. 17, 2020

(54) INTEGRATED ASSEMBLY PACKAGE MOUNTING CLIP

(71) Applicant: MACOM Technology Solutions Holdings, Inc., Lowell, MA (US)

(72) Inventors: Michael R. Johnson, Leominster, MA (US); Paul A. Cushion, Dunstable, MA (US); Paul E. Hogan, Burlington, MA (US); Paul Panaccione, Amesbury, MA (US); Dave G. Persad, Chelmsford, MA (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 0 days.

(21) Appl. No.: 16/058,517

(22) Filed: Aug. 8, 2018

(65) Prior Publication Data

US 2019/0049674 A1 Feb. 14, 2019

Related U.S. Application Data

(60) Provisional application No. 62/542,963, filed on Aug. 9, 2017.

(51) Int. Cl.
*G02B 6/36* (2006.01)
*G02B 6/42* (2006.01)
*H05K 1/18* (2006.01)

(52) U.S. Cl.
CPC ........... *G02B 6/424* (2013.01); *G02B 6/4219* (2013.01); *G02B 6/4257* (2013.01); *H05K 1/181* (2013.01); *H05K 1/184* (2013.01); *H05K 1/185* (2013.01); *G02B 2006/4297* (2013.01); *H05K 2201/10386* (2013.01)

(58) Field of Classification Search
CPC .. G02B 6/4214; G02B 6/4292; G02B 6/4284; G02B 6/428; G02B 6/36
See application file for complete search history.

(56) References Cited

U.S. PATENT DOCUMENTS

| 9,703,179 B2* | 7/2017 | Bonner | G09F 19/18 |
|---|---|---|---|
| 2017/0208888 A1* | 7/2017 | Volmer | A42B 1/24 |
| 2017/0311717 A1* | 11/2017 | Nilsson | F16B 12/50 |

* cited by examiner

*Primary Examiner* — Jennifer Doan
(74) *Attorney, Agent, or Firm* — Thomas | Horstemeyer, LLP.; Jason M. Perilla

(57) ABSTRACT

A mounting clip can be placed and secured over the exterior surfaces of a package of an integrated optical assembly. The mounting clip includes a top panel, end clips that curl and extend down from end edges of the top panel, an interference tab that extends up from the top panel, and cap clips that curl and extend up from the top panel. The mounting clip is dimensioned such that bends in the end clips press and secure against exterior side surfaces of the package of the integrated assembly. Thus, the mounting clip can be secured to the package of the integrated assembly using an interference or friction fit. A cap on a fiber optic cable that extends from the package can be curled around and secured between the interference tab and cap clips of the mounting clip to secure it during surface mounting.

20 Claims, 9 Drawing Sheets

INTEGRATED ASSEMBLY PACKAGE MOUNTING CLIP

CROSS-REFERENCE TO RELATED APPLICATIONS

This application claims the benefit of U.S. Provisional Application No. 62/542,963, filed Aug. 9, 2017, the entire contents of which is hereby incorporated herein by reference.

BACKGROUND

Various types of packages are available for electrical components and integrated circuits and circuit assemblies. The packages can both protect and secure the components and provide electrically conductive leads or contacts for electrical connections to larger circuits. Such packages can be surface mounted, through-hole mounted, or inserted into printed circuit boards, for example. The type, size, contact style, and materials of a package for a device can be chosen based on the components being housed within the package and the application in which the device is being used, among other factors.

BRIEF DESCRIPTION OF THE DRAWINGS

Aspects of the present disclosure can be better understood with reference to the following drawings. It is noted that the elements in the drawings are not necessarily to scale, with emphasis instead being placed upon clearly illustrating the principles of the embodiments. In the drawings, like reference numerals designate like or corresponding, but not necessarily the same, elements throughout the several views.

DETAILED DESCRIPTION

As noted above, various types of packages are available for electrical components and integrated circuits and circuit assemblies. The packages can both protect and secure the components and provide electrically conductive leads or contacts for electrical connections to larger circuits. Such packages can be surface mounted, through-hole mounted, or inserted into printed circuit boards, for example. The type, size, contact style, and materials of a package for a device can be chosen based on the components being housed within the package and the application in which the device is being used, among other factors.

In the field of optical communications, Receiver Optical Sub Assemblies (ROSAs) and Transmission Optical Sub Assemblies (TOSAs) are being manufactured in integrated assembly packages, including several optical components and associated electrical circuitry. As one type of example package, ROSAs and TOSAs can be assembled into flat no-leads packages, such as Quad-Flat No-leads (QFN) or Dual-Flat No-leads (DFN) packages. Flat no-leads packages are one of several types of packages that can be used to package and electrically connect integrated optical and electrical components to Printed Circuit Boards (PCBs). Flat no-leads packages typically include a surface mount Land Grid Array (LGA) pad design on one side for surface mounting (and electrically coupling) onto a PCB.

Figure 1:
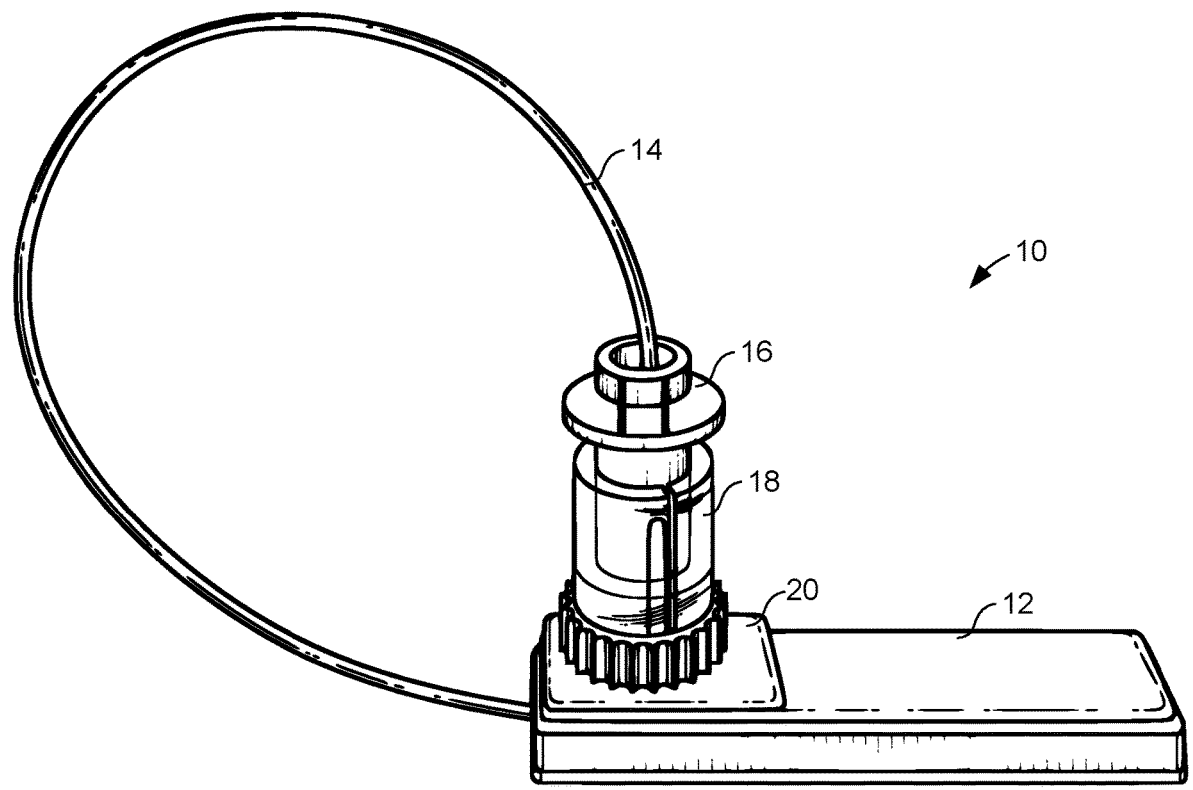
FIG. 1 illustrates an example optical sub assembly with optical fiber according to various embodiments described herein.

Some ROSA and TOSA packages include optical fiber connections for optical communications. FIG. 1 illustrates an example integrated optical assembly package 10 including an optical sub assembly 12 with optical fiber 14 extending from one end. In the example shown in FIG. 1, the optical sub assembly 12 is enclosed in a QFN package, although the concepts described herein can be applied to other sizes, shapes, and forms of integrated assembly packages. An optical connector 16 is attached at one end of the optical fiber 14 for connection to another component in a larger optical communications system. A cap 18 is fitted over the optical connector 16, as shown in FIG. 1, to protect the optical connector 16 and the optical fiber 14 before the optical sub assembly 12 is connected into the larger system.

The optical sub assembly 12 is designed to be surface mounted onto a PCB, possibly using an automated surface mount (SMT) pick and place machine or system. However, problems can arise if the optical fiber 14 is left free or loose during SMT placement of the optical sub assembly 12. One technique to secure the optical fiber 14 during SMT placement has been to use an adhesive member 20 to stick the cap 18 to a top surface of the package of the optical sub assembly 12 as shown in FIG. 1. The adhesive member 20 can be a piece of double-sided tape, such as double-sided KAPTON® tape, among other suitable means. The use of the adhesive member 20 creates other problems, however, and can lead to time consuming and/or problematic steps in the manufacturing process.

In the context outlined above, the embodiments described herein are directed to a mounting clip for an integrated assembly package. The mounting clip can be placed and secured over the exterior surfaces of the package of an integrated assembly, such as a Receiver Optical Sub Assembly (ROSA) or Transmission Optical Sub Assembly (TOSA). The mounting clip includes a top panel, end clips that curl and extend down from end edges of the top panel, an interference tab that extends up from the top panel, and cap clips that curl and extend up from the top panel. The mounting clip is dimensioned such that bends in the end clips press and secure against the exterior side surfaces of the package of the integrated assembly. Thus, the mounting clip can be secured to the package of the integrated assembly using an interference or friction fit. A cap on a fiber optic cable that extends from the integrated assembly package can thus be curled around and secured between the interference tab and the cap clips of the mounting clip to secure it during surface mount assembly processes.

Figure 2:
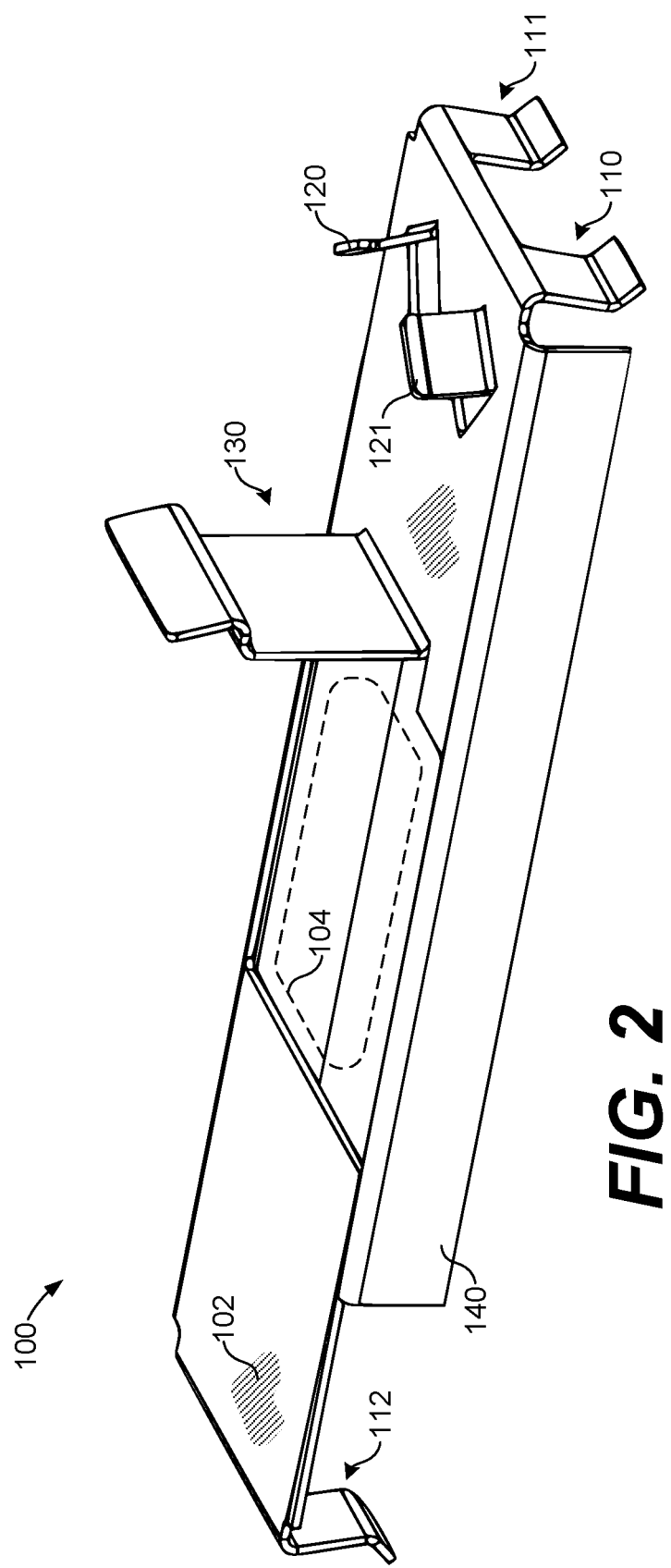
FIG. 2 illustrates a perspective view of an example mounting clip for an integrated assembly package according to various embodiments described herein.
Figure 3:
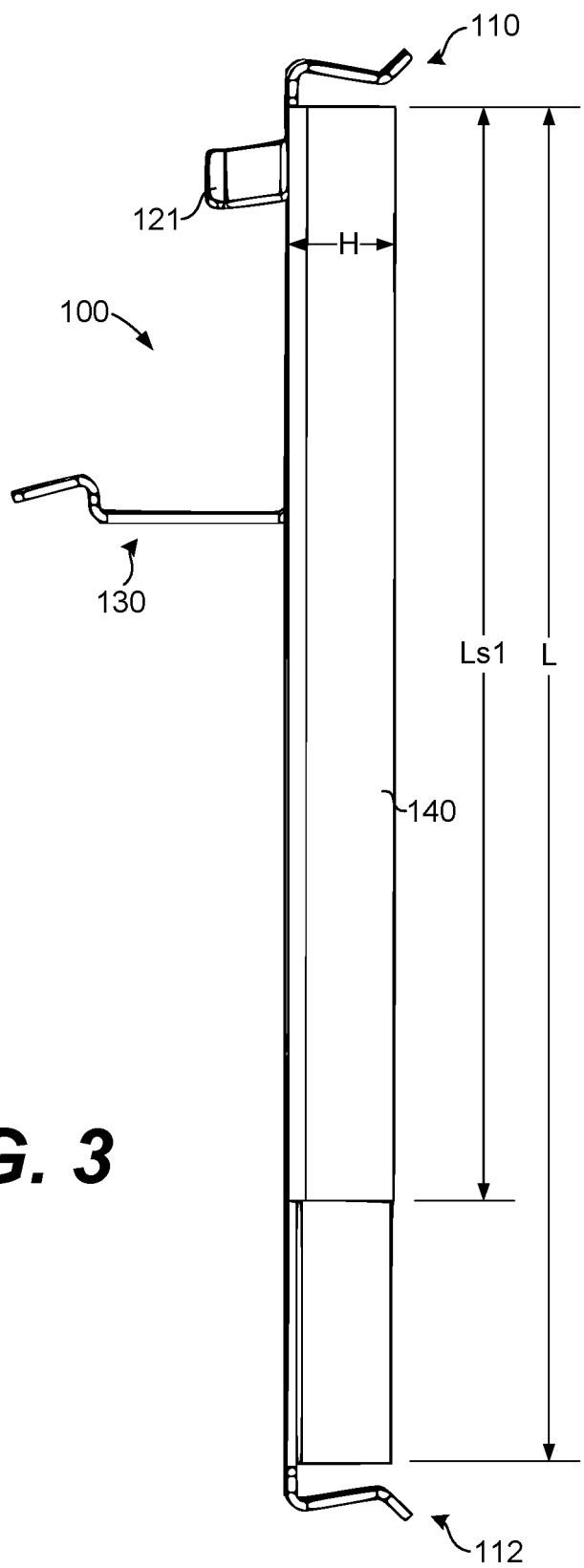
FIG. 3 illustrates a side view of the mounting clip shown in FIG. 2 according various embodiments described herein.
Figure 4:
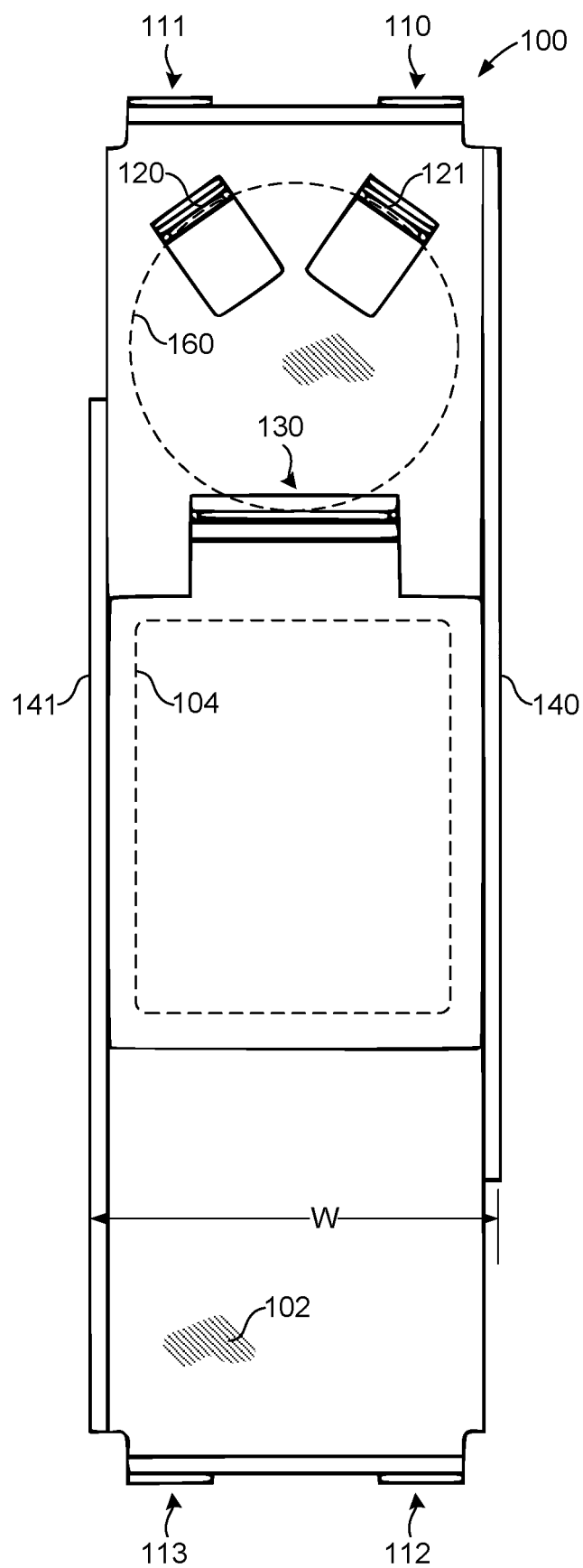
FIG. 4 illustrates a top-down view of the mounting clip shown in FIG. 2 according various embodiments described herein.
Figure 5:
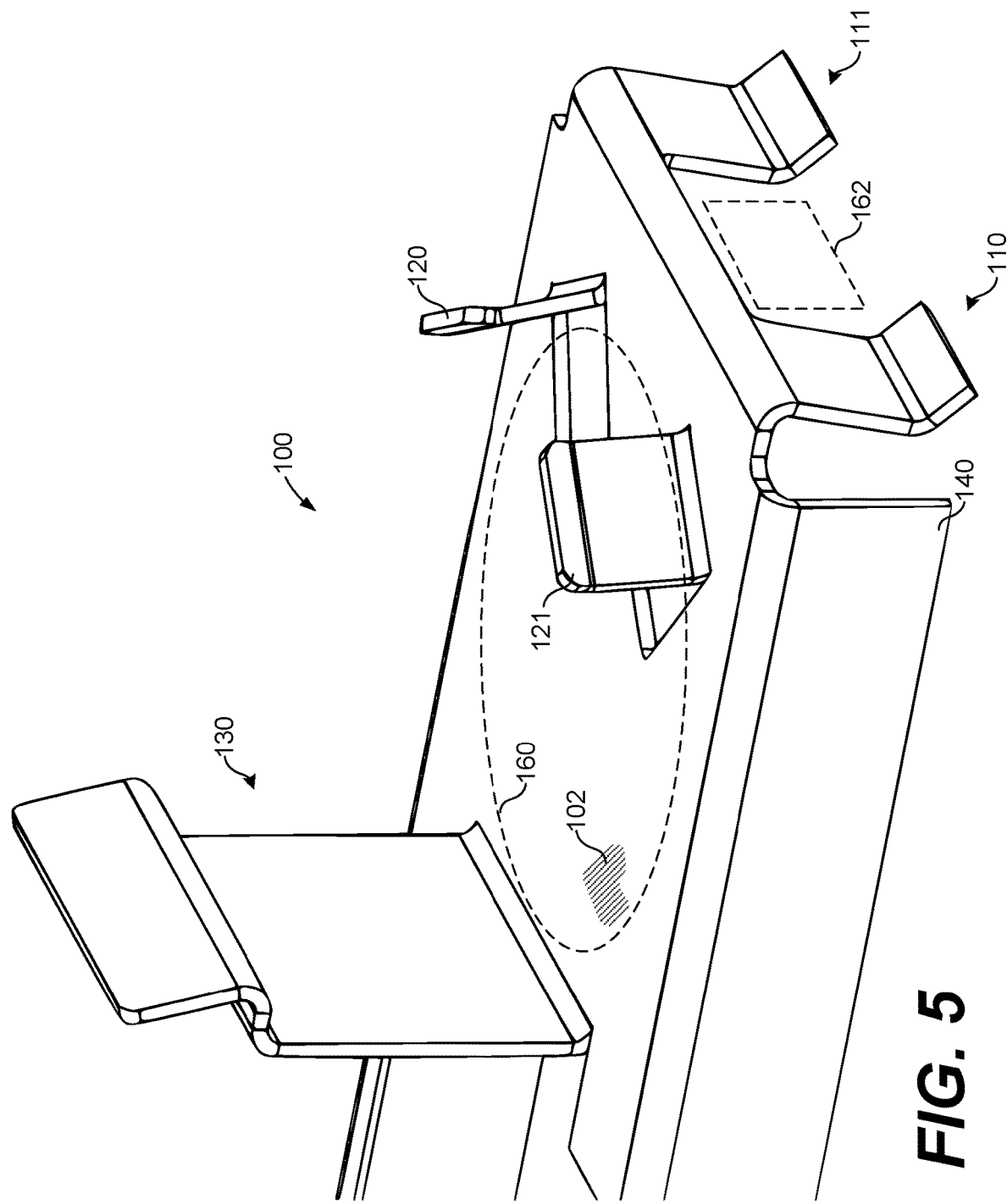
FIG. 5 illustrates a perspective view of clips over the mounting clip shown in FIG. 2 according various embodiments described herein.

Turning to the other drawings, FIG. 2 illustrates a perspective view of an example mounting clip 100 for an integrated assembly package according to various embodiments described herein. Further, FIG. 3 illustrates a side view of the mounting clip 100 shown in FIG. 2, FIG. 4 illustrates a top-down view of the mounting clip 100 shown in FIG. 2, and FIG. 5 illustrates a perspective view of clips over the mounting clip 100 shown in FIG. 2. As described herein, the mounting clip 100 is designed to be secured over the package of an integrated device or assembly, such as the optical sub assembly 12 shown in FIG. 1, by an interference fit with the exterior surfaces of the package.

Referring among FIGS. 2-5, the mounting clip 100 includes a top panel 102 having an opening 104, end clips 110-113 that curl and extend down from end edges of the top panel 102, side panels 140 and 141 that bend and extend down from a side edges of the top panel 102, cap clips 120 and 121 that turn and extend up from the top panel 102, and an interference tab 130 that extends up from the top panel 102. The mounting clip 100 can be formed from a metal or metallic alloy, plastic, or other suitable material(s). In one embodiment, the mounting clip 100 can be formed from a beryllium copper alloy of about 0.005" thickness, although other alloys at other thicknesses are within the scope of the embodiments.

Before turning to describe specific aspects of the mounting clip 100, it is noted that the embodiment shown in FIGS. 2-5 is provided by way of example. The embodiment is not drawn to scale, and other embodiments consistent with the concepts described herein can vary in shape and/or size as compared to that shown. For example, the length "L," width "W," and height "H" of the mounting clip 100 shown in FIGS. 3 and 4 can vary to fit packages of any suitable size. Similarly, as described below with reference to FIGS. 6 and 7, the size, number, and position of the end clips 110-113, the cap clips 120 and 121, and the interference tab 130 can vary from that shown.

In use, the mounting clip 100 can be placed and secured over the package of an integrated device or assembly, such as the optical sub assembly 12 shown in FIG. 1. Based on the dimensions of the mounting clip 100, the end clips 110-113 interfere with (e.g., press upon) the exterior surfaces of the package when placed over the package. Due to that interference, the mounting clip 100 can be held in place over the package. On the other hand, a clearance can exist between the exterior surfaces of the package and the side panels 140 and 141 of the mounting clip 100. In other embodiments, the mounting clip 100 can include clips that interfere with (e.g., press upon) the exterior surfaces of a package in place of one or both of the side panels 140 and 141. In that case, the mounting clip 100 could include both end clips similar to the end clips 110-113 and side clips that curl and extend down from side edges of the top panel 102.

As shown in FIGS. 4 and 5, surfaces of the cap clips 120 and 121 and the interference tab 130 delineate a region 160 to secure an item over the top panel 102 of the mounting clip 100. Thus, with the mounting clip 100 secured in place over a package, an item, such as the cap 18 of the optical connector 16 shown in FIG. 1, can be secured in place by an interference fit between the cap clips 120 and 121 and the interference tab 130.

FIG. 5 also illustrates a region 162 between the end clips 110 and 111. The region 162 is open to allow an optical fiber that extends from an end or side of an integrated assembly package, such as the optical fiber 14 that extends from the optical sub assembly 12 as shown in FIG. 1, to pass between the end clips 110 and 111. A region similar to the region 162 is open between the end clips 112 and 113. Thus, the mounting clip 100 is designed so as not to interfere with one or more optical fibers that extend from ends or sides of the integrated assembly package upon which it can be fitted and secured.

Figure 6:
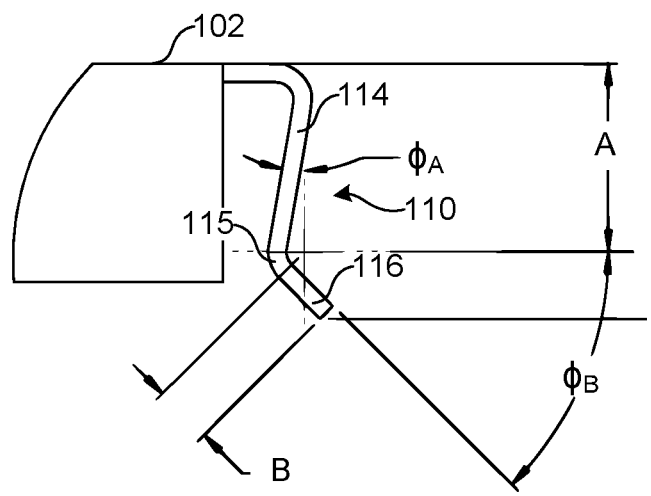
FIG. 6 illustrates a detailed side view of an end clip of the mounting clip shown in FIG. 2 according various embodiments described herein.

FIG. 6 illustrates a detailed side view of the end clip 110 shown in FIG. 2. The end clip 110 shown in FIG. 6 is representative of the end clips 110-113 of the mounting clip 100. The end clip 110 can vary in dimensions and shape from the example shown in FIG. 6. For example, the end clip 110 can be longer or shorter than that shown. Also, the angles between the segments and bends, as described below, can vary from those illustrated.

As shown in FIG. 6, the end clip 110 includes an interference segment 114, a bend 115 at an end of the interference segment 114, and a clip catch 116 at an end of the bend 115. The interference segment 114 extends a distance A from the top panel 102 to the bend 115, and the clip catch 116 extends a distance B from the bend 115. The interference segment 114 of the end clip 110 extends down from the top panel 102 at an angle $\phi_A$ with respect to a direction perpendicular to a surface of the top panel 102. Further, the clip catch 116 of the end clip 110 extends at an angle $\phi_B$ with respect to the surface of the top panel 102. In other embodiments, the distances A and B and the angles $\phi_A$ and $\phi_B$ can vary. The distances and angles can vary based on a number of factors, such as the size of the package upon which the mounting clip 100 will be secured, the materials from which the mounting clip 100 is formed, the amount of force required to place the mounting clip 100 on and remove the mounting clip 100 from an integrated assembly package, and other factors.

Figure 7:
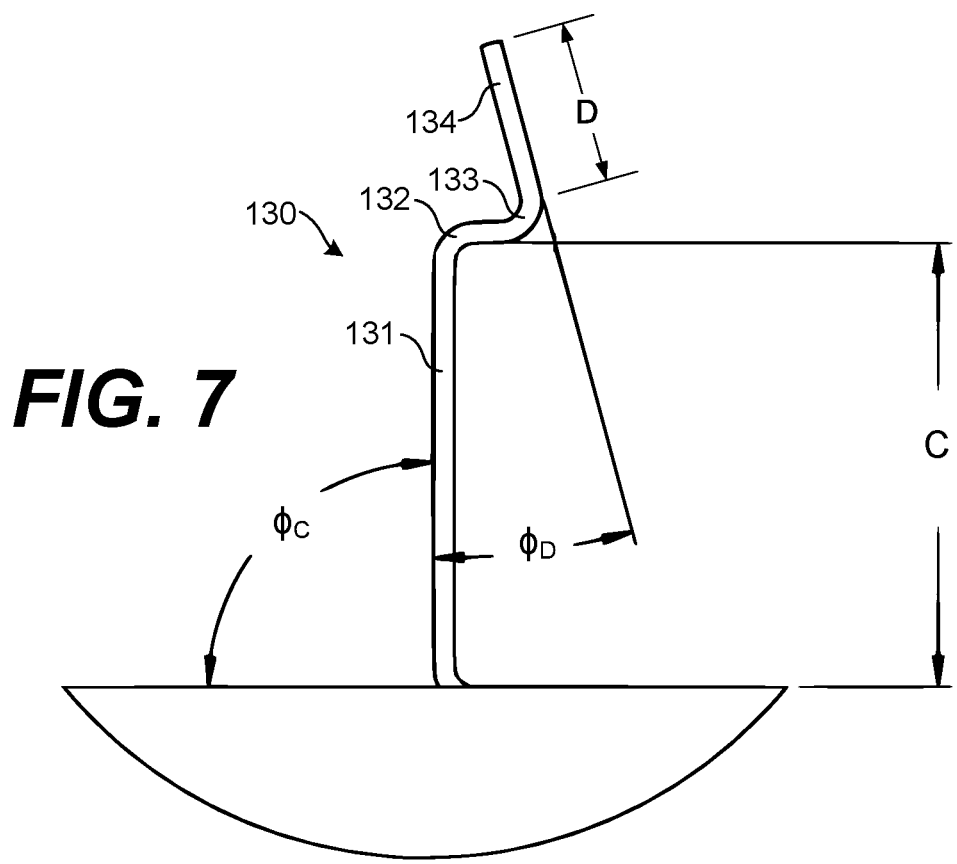
FIG. 7 illustrates a detailed side view of an interference tab of the mounting clip shown in FIG. 2 according various embodiments described herein.

FIG. 7 illustrates a detailed side view of the interference tab 130 of the mounting clip 100 shown in FIG. 2. The interference tab 130 shown in FIG. 7 is provided as a representative example. The interference tab 130 can vary in dimensions and shape from the example shown in FIG. 7. For example, the interference tab 130 can be longer or shorter than that shown. Also, the angles between the segments and bends, as described below, can vary from those illustrated.

As shown in FIG. 7, the interference tab 130 includes a tab segment 131, a tab bend 132 at an end of the tab segment 131, a tab knee 133, and a tab catch 134 at an end of the tab knee 133. The tab segment 131 extends a distance C from the top panel 102 to the tab bend 132, and the tab catch 134 extends a distance D from the tab knee 133. The tab segment 131 extends up from the top panel 102 in a direction substantially perpendicular to the surface of the top panel 102 (e.g., $\phi_C$ is about 90 degrees). Further, the tab catch 134 extends at an angle $\phi_D$ with respect to the direction perpendicular to the surface of the top panel 102. In other embodiments, the distances C and D and the angles $\phi_B$ and $\phi_C$ can vary. The lengths and angles can vary based on various factors, such as the size of the item being secured over the top panel 102, the materials from which the mounting clip 100 is formed, and other factors.

Figure 8A:
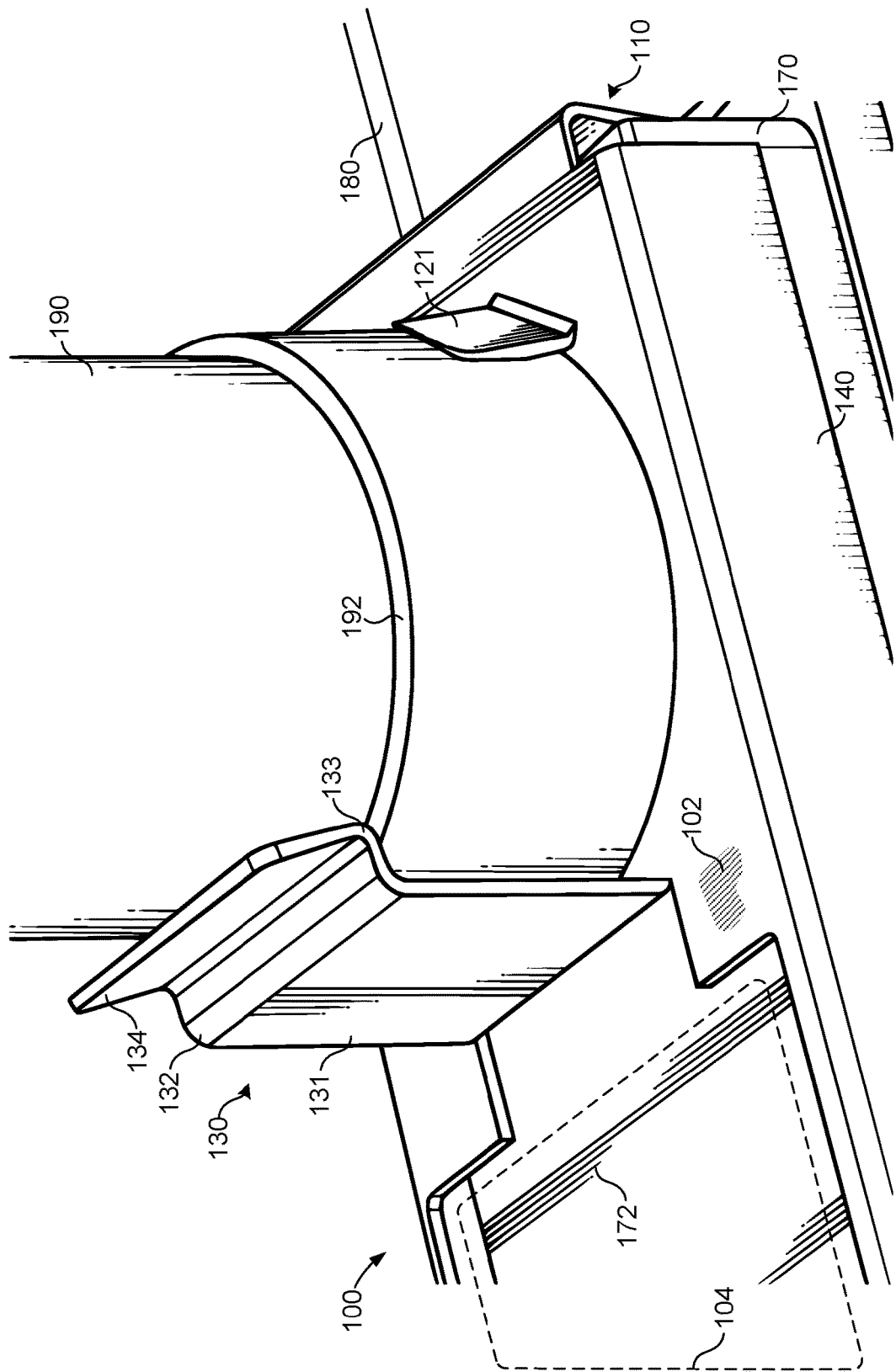
FIG. 8A illustrates a partial perspective view of the mounting clip shown in FIG. 2 installed on an example package according various embodiments described herein.
Figure 8B:
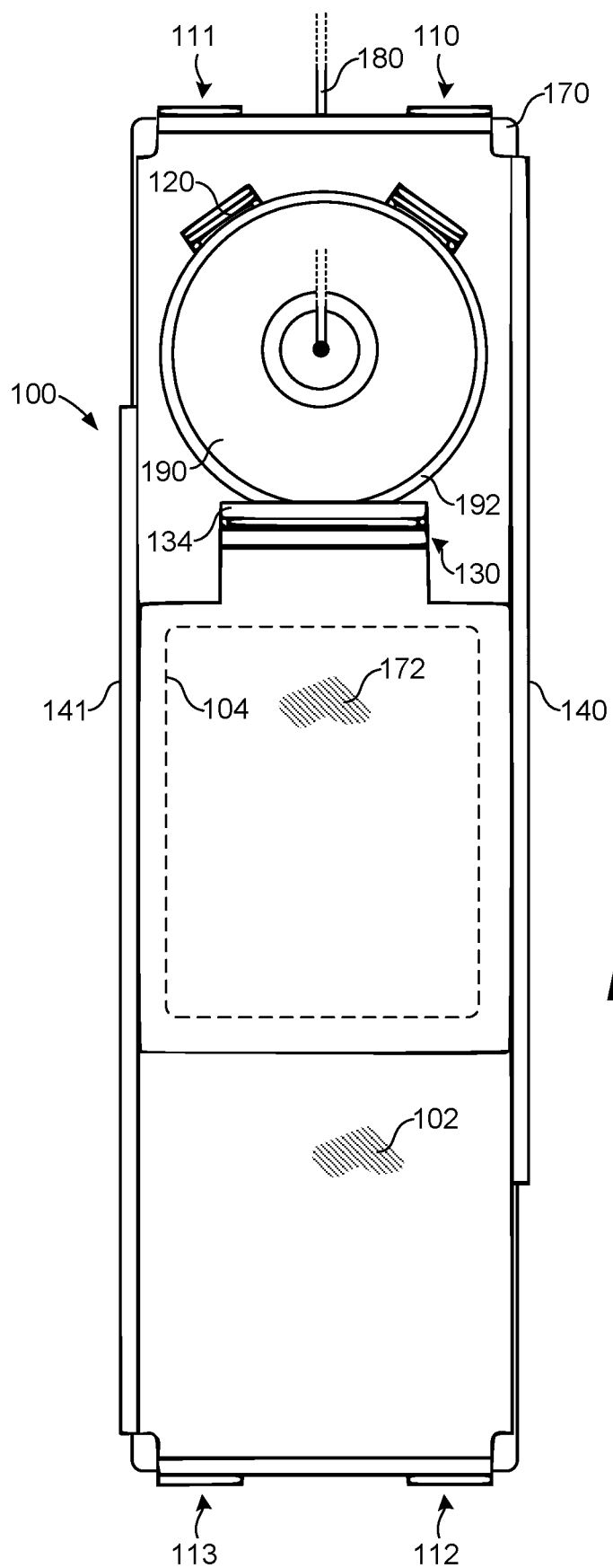
FIG. 8B illustrates a top-down view of the mounting clip shown in FIG. 2 installed on the example package according various embodiments described herein.

FIG. 8A illustrates a partial perspective view of the mounting clip 100 on an example package 170, and FIG. 8B illustrates a top-down view of the mounting clip 100 installed on the example package 170. The package 170 can be embodied as an integrated assembly package including an optical fiber 180 that extends from one side or end. As best shown in FIG. 8B, the end clips 110-113 of the mounting clip 100 contact and provide an interference or friction fit against the end sides of the package 170, to secure the mounting clip 100 on the package 170 through an interference fit. In the example shown, the side panels 140 and 141 of the mounting clip 100 do not contact the package 170. Instead, a clearance exists between the side panels 140 and 141 and the package 170.

FIGS. 8A and 8B also illustrate a cap 190 secured between the interference tab 130 and the cap clips 120 and 121 of the mounting clip 100. The cap 190 can be fitted over an optical connector at a distal end of the optical fiber 180, similar to the way that the cap 18 is fitted over the optical connector 16 at the distal end of the optical fiber 14 shown in FIG. 1. In that context, the cap 190 shown in FIGS. 8A and 8B can be similar to the cap 18 shown in FIG. 1. The cap 190 can be used, for example, to protect the optical fiber 180 and the optical connector connected at the distal end of the optical fiber 180.

As shown in FIGS. 8A and 8B, the cap 190 can fit and be secured in the region between the cap clips 120 and 121 and the interference tab 130. In that position, the cap 190 can be secured in place by an interference fit between the surfaces of the cap clips 120 and 121 and the interference tab 130. The tab knee 133 of the interference tab 130 (FIG. 8A) maintains an interference fit against a rim ledge 192 of the cap 190, holding the cap 190 down against a top surface of the top panel 102. The cap 190 is secured in place over the top panel 102 of the mounting clip 100 through the interference or friction fit between the cap clips 120 and 121, the interference tab 130, and the cap 190.

The cap 190 can be released from the position shown in FIGS. 8A and 8B by pulling back on the tab catch 134 to release the interference between the tab knee 133 of the interference tab 130 and the rim ledge 192 of the cap 190. The interference tab 130 can be designed at any suitable size and/or shape to secure caps or other items of various shapes and sizes.

Thus, the mounting clip 100 can be secured on the package 170 through an interference fit between the end clips 110-113 and the sides of the package 170. The cap 190 can then be secured in place over the top panel 102 by contact between the cap clips 120 and 121 and a body of the cap 190 and an interference fit between the interference tab 130 and the rim ledge 192 of the cap 190. In that way, the optical fiber 180 can be secured in place rather than left free or loose, and the package 170, the optical fiber 180, and the cap 190 can be safely moved and positioned together.

In one example, the package 170, optical fiber 180, and cap 190 can be moved using an automated SMT pick and place machine or system. SMT pick and place machines are automated machines used to place surface-mount devices (SMDs) onto printed circuit boards (PCBs). SMT machines can be relied upon for high speed, high precision placement of a range of electronic components, such as capacitors, resistors, and integrated device packages onto PCBs. Some SMT machines use pneumatic suction nozzles or cups pick device packages for placement. A suction cup of an SMT machine can adhere to a surface 172 of the package 170 through the opening 104 in the mounting clip 100. The SMT machine can thus pick the package 170 and the mounting clip 100 together. The SMT machine can then move and place the package 170, along with the optical fiber 180 and the cap 190, and the mounting clip 100 together.

A method or process of picking and placing an integrated assembly package using a mounting clip according to the concepts described herein can include a number of steps. An example of the steps is provided below with reference to the mounting clip 100 and the package 170 shown in FIGS. 8A and 8B, but the process can be performed using other mounting clips and packages. Although the process is described in a particular sequence, the steps can be conducted in any suitable order.

To begin, the process can include securing a mounting clip similar to the mounting clip 100 on an integrated assembly package similar to the package 170. The mounting clip 100 can be placed over the package 170 and secured into place through an interference fit between the end clips 110-113 and the sides of the package 170. This may include press-fitting the mounting clip 100 down onto the package 170.

Next, the process can include securing the cap 190 at the distal end of the optical fiber 180 in place over the top panel 102 of the mounting clip 100. The cap 190 can be secured in place by contact between the cap clips 120 and 121 and a body of the cap 190 and an interference fit between the interference tab 130 and the rim ledge 192 of the cap 190. In that way, the optical fiber 180 can be secured in place rather than left free or loose, and the package 170, the optical fiber 180, and the cap 190 can be safely moved and positioned together.

The process can then include picking the package 170 and the mounting clip 100 together. For example, a suction nozzle or cup of an SMT machine can adhere to the surface 172 of the package 170 through the opening 104 in the mounting clip 100 as shown in FIGS. 8A and 8B. The process can then include the SMT machine moving and placing the package 170 and the mounting clip 100 together, along with the optical fiber 180 and the cap 190. The package 170 and the mounting clip 100 can be moved and placed onto a PCB, for example, for soldering electrical contacts of the package 170 to corresponding electrical contacts on the PCB. After the package 170 is placed, the process can include releasing the cap 190 from the mounting clip 100 and removing the mounting clip 100 from the package 170.

Figure 9:
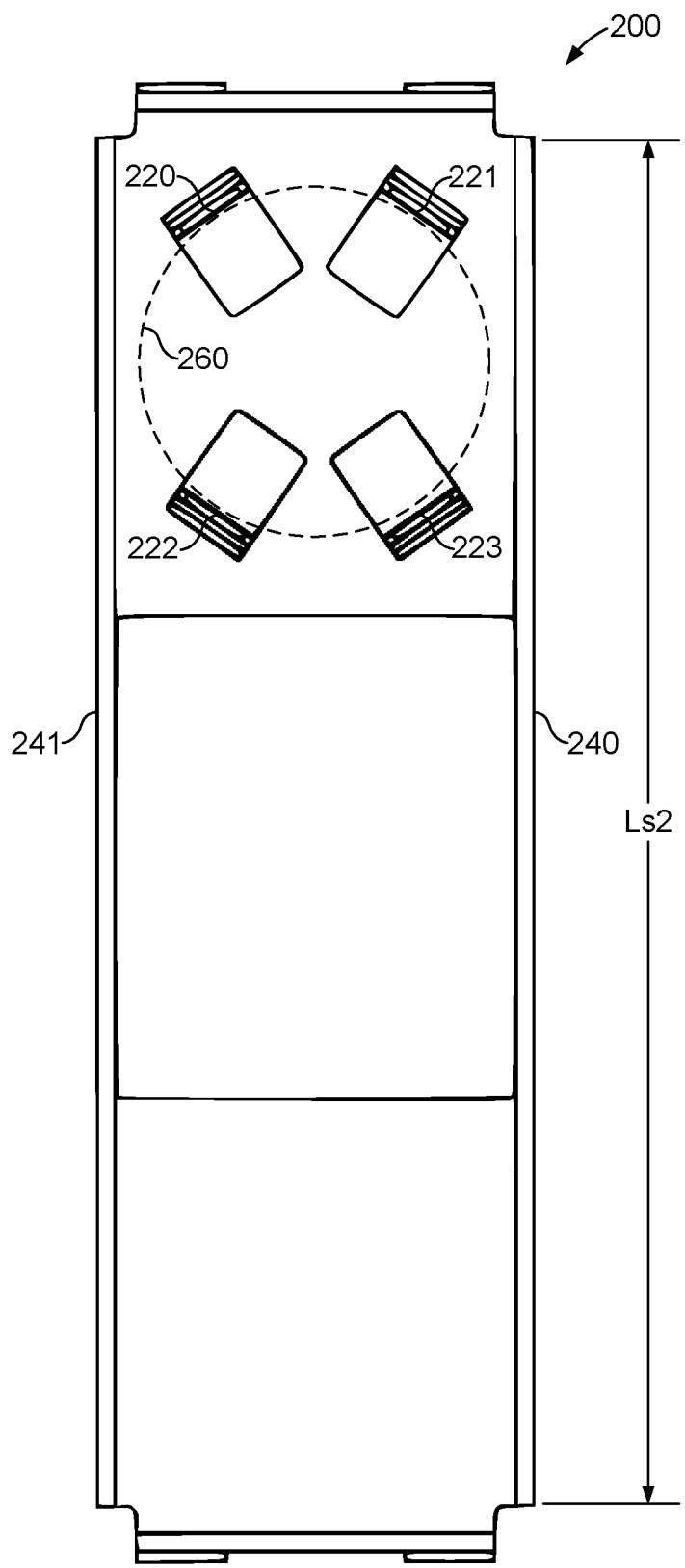
FIG. 9 illustrates a top-down view of another example mounting clip for an integrated assembly package according to various embodiments described herein.

Turning to other examples, FIG. 9 illustrates a top-down view of another example mounting clip 200. The mounting clip 200 is similar to the mounting clip 100 shown in FIGS. 2-7 but varies in certain structural characteristics. First, the side panels 240 and 241 are longer and extend a length "Ls2" as compared to the length "Ls1" of the side panels 140 and 141 (see FIG. 3). Second, the mounting clip 200 omits the interference tab 130 and, instead, includes four cap clips 220-223 rather than the two cap clips 120 and 121 of the mounting clip 100. A cap similar to the cap 190 shown in FIGS. 8A and 8B can be press fitted into the region 260 between the cap clips 220-223 to secure the cap into place, without the use of the interference tab 130 of the mounting clip 100.

In other variations, the mounting clips 100 and 200 can also include additional cap clips and/or interference tabs to secure two caps. In that way, the mounting clips 100 and 200 can be used to secure two optical connectors of two different optical fibers that extend from the same or different sides of an integrated assembly package. The mounting clips 100 and 200 can also include additional (or fewer) end clips on the ends or the sides of the mounting clips 100 and 200.

The mounting clips described herein can be manufactured in any suitable way. In one example, a process for manufacturing can include shearing or punching a number of mounting clips blanks out from a larger metal sheet using a metal press having one or more shearing blades or punching die. The metal sheet can be a beryllium copper alloy sheet between about 0.002" and about 0.01" in thickness, although other thicknesses of other metal alloys can be used.

Although flat, the mounting clip blanks can include a top panel similar to the top panel 102, one or more end clips similar to the end clips 110-113, one or more side panels similar to the side panels 140 and 141, clips similar to the cap clips 120 and 121, and an interference tab similar to the interference tab 130.

After the shearing, the process can include bending the side panels and end clips. For example, the side panels 140 and 141 can be bent to extend in a first direction down from the top panel 102. Similarly, the end clips 110-113 can be bent to extend in the first direction down from the top panel 102. The end clips 110-113 can be bent to have the interference, bend, and clip catch portions as described above with reference to FIG. 6.

The process can also include bending the cap clips and the interference tab. For example, the cap clips 120 and 121 can be bent to extend in a second direction up from the top panel 102. Similarly, the interference tab 130 can be bent to extend in the second direction up from the top panel 102. The interference tab 130 can be bent to have the interference, knee, bend, and clip catch portions as described above with reference to FIG. 7. Each of the end clips, cap clips, and interference tab can be bent in a suitable way to maintain a sufficient amount of metallic memory or spring to achieve the interference or friction fittings described herein.

Although embodiments have been described herein in detail, the descriptions are by way of example. The features of the embodiments described herein are representative and, in alternative embodiments, certain features and elements can be added or omitted. Additionally, modifications to aspects of the embodiments described herein can be made by those skilled in the art without departing from the spirit and scope of the present invention defined in the following claims, the scope of which are to be accorded the broadest interpretation so as to encompass modifications and equivalent structures.

Therefore, the following is claimed:

1. A mounting clip for use with a package for a device, comprising:
   a top panel;
   at least one package clip that extends at least in part in a first direction from a periphery of the top panel, the at least one package clip comprising an interference segment to secure the mounting clip on the package; and
   at least one auxiliary clip that extends at least in part in a second direction from the top panel to secure at least one item over the top panel.

2. The mounting clip of claim 1, wherein:
   the at least one package clip extends down from an edge of the top panel; and
   the at least one package clip further comprises a bend at an end of the interference segment and a clip catch at an end of the bend.

3. The mounting clip of claim 1, wherein the at least one package clip comprises:
   a first end package clip that extends down from a first end edge of the top panel; and
   a second end package clip that extends down from a second end edge of the top panel.

4. The mounting clip of claim 1, wherein:
   the at least one auxiliary clip comprises:
      an interference tab that extends up from the top panel; and
      a plurality of clips that extend up from the top panel; and
      surfaces of the interference tab and the plurality of clips delineate a region to secure the at least one item over the top panel.

5. The mounting clip of claim 1, further comprising a side panel that extends at least in part in the first direction from the periphery of the top panel.

6. A mounting clip for use with a package for a device, comprising:
   a top panel comprising an opening;
   a first end clip that curls and extends down from a first end edge of the top panel, the first end clip including an interference segment, a bend at an end of the interference segment, and a clip catch at an end of the bend;
   a second end clip that curls and extends down from a second end edge of the top panel;
   an interference tab that extends up from the top panel; and
   a plurality of cap clips that turn and extend up from the top panel, wherein
   surfaces of the interference tab and the plurality of cap clips delineate a region to secure at least one item over the top panel.

7. The mounting clip of claim 6, further comprising a side panel that bends and extends down from a side edge of the top panel in a direction perpendicular to a surface of the top panel.

8. The mounting clip of claim 6, wherein:
   the interference segment of the first end clip extends down from the top panel at a first angle with respect to a direction perpendicular to a surface of the top panel; and
   the clip catch of the first end clip extends at a second angle with respect to the surface of the top panel.

9. The mounting clip of claim 6, wherein the interference tab includes a tab segment, a tab bend at an end of the tab segment, and a tab catch at an end of the tab bend.

10. The mounting clip of claim 9, wherein:
    the tab segment of the interference tab extends up from the top panel at in a direction substantially perpendicular to a surface of the top panel; and
    the tab catch of the interference tab extends at an angle with respect to a direction perpendicular to a surface of the top panel.

11. The mounting clip of claim 6, wherein:
    the first end clip comprises a first plurality of end clips that curl and extend down from the first end edge of the top panel; and
    the second end clip comprises a second plurality of end clips that curl and extend down from the second end edge of the top panel.

12. A mounting system, comprising:
    an integrated assembly package, the integrated assembly package comprising an optical fiber that extends from the integrated assembly package; and
    a mounting clip secured over the integrated assembly package, wherein the mounting clip comprises:
       a top panel;
       at least one package clip that extends down from a periphery of the top panel, the at least one package clip including an interference segment to secure the mounting clip on the integrated assembly package through an interference fit; and
       at least one auxiliary clip that extends up from the top panel to secure a distal end of the optical fiber over the top panel.

13. The mounting system of claim 12, wherein the at least one package clip comprises:

a first end clip that extends down from a first end edge of the top panel, the first end clip including a first bend that contacts an exterior surface of the integrated assembly package to secure the mounting clip on the integrated assembly package with an interference fit; and a second end clip that extends down from a second end edge of the top panel, the second end clip including a second bend that contacts the exterior surface of the integrated assembly package.

14. The mounting system of claim 12, wherein the at least one auxiliary clip comprises:

an interference tab that extends up from the top panel; and a plurality of cap clips that extend up from the top panel, wherein surfaces of the interference tab and the plurality of cap clips delineate a region to secure a cap of an optical connector at the distal end of the optical fiber over the top panel.

15. The mounting system of claim 14, wherein the interference tab includes a tab segment, a tab knee at an end of the tab segment, and a tab catch.

16. The mounting system of claim 15, wherein the tab knee interferes with a rim ledge of the cap to secure the cap of the optical connector over the top panel through an interference fit.

17. The mounting system of claim 12, wherein the mounting clip further comprises a side panel that extends down from the periphery of the top panel in a direction perpendicular to a surface of the top panel.

18. The mounting system claim 12, wherein:

an interference segment of the at least one package clip extends down from the top panel at a first angle with respect to a direction perpendicular to a surface of the top panel; and a clip catch of the at least one package clip extends at a second angle with respect to the surface of the top panel.

19. The mounting system claim 12, wherein the top panel comprises an opening for automated surface mount placement of the integrated assembly package along with the mounting clip secured on the integrated assembly package.

20. The mounting system claim 12, wherein the mounting clip is formed of a beryllium copper alloy.

* * * * *